United States Patent
Park et al.

(10) Patent No.: US 7,389,491 B2
(45) Date of Patent: Jun. 17, 2008

(54) METHODS, SYSTEMS AND COMPUTER PROGRAM PRODUCTS FOR CORRECTING PHOTOMASK USING AERIAL IMAGES AND BOUNDARY REGIONS

(75) Inventors: Ji-Soong Park, Gyeonggi-do (KR); Sung-Min Huh, Gyeonggi-do (KR); Seong-Woon Choi, Gyeonggi-do (KR); In-Kyun Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 385 days.

(21) Appl. No.: 11/268,791

(22) Filed: Nov. 8, 2005

(65) Prior Publication Data

US 2006/0204862 A1  Sep. 14, 2006

(30) Foreign Application Priority Data

Mar. 14, 2005  (KR)  ............... 10-2005-0021095

(51) Int. Cl.
*G06F 17/50* (2006.01)
*G06K 9/00* (2006.01)

(52) U.S. Cl. .................................. 716/21; 382/144
(58) Field of Classification Search ............. 716/19–21; 382/144, 149, 151; 700/121
See application file for complete search history.

(56) References Cited

U.S. PATENT DOCUMENTS

| 6,016,357 | A | * | 1/2000 | Neary et al. ................. 382/144 |
| 6,106,980 | A | * | 8/2000 | Pierrat et al. ................. 430/5 |
| 6,162,564 | A | * | 12/2000 | Hieda et al. ................. 430/5 |
| 6,433,437 | B1 | | 8/2002 | Hosono et al. |
| 7,155,698 | B1 | * | 12/2006 | Gennari ....................... 716/19 |
| 7,194,725 | B1 | * | 3/2007 | Lukanc et al. ............... 716/19 |
| 7,313,769 | B1 | * | 12/2007 | Lukanc et al. ............... 716/2 |
| 2003/0077524 | A1 | | 4/2003 | Choi |
| 2003/0138706 | A1 | * | 7/2003 | Progler et al. ................. 430/5 |
| 2003/0219154 | A1 | * | 11/2003 | Medvedeva et al. ......... 382/144 |
| 2005/0097500 | A1 | * | 5/2005 | Ye et al. ....................... 716/20 |
| 2005/0118515 | A1 | * | 6/2005 | Progler et al. ................. 430/5 |
| 2006/0008716 | A1 | * | 1/2006 | Jeunink et al. ............... 430/30 |
| 2006/0129966 | A1 | * | 6/2006 | Rodin et al. .................. 716/19 |
| 2006/0210891 | A1 | * | 9/2006 | Progler et al. ................. 430/5 |
| 2007/0022402 | A1 | * | 1/2007 | Ye et al. ....................... 716/21 |

(Continued)

FOREIGN PATENT DOCUMENTS

JP  2002-72439 A  3/2002

(Continued)

OTHER PUBLICATIONS

Budd et al., "Development and application of a new tool for lithographic mask evaluation, the stepper equivalent Aerial Image Measurement System, AIMS", *IBM J. Res. Develop.*, vol. 41, No. 1/2, Jan./Mar. 1997, pp. 119-128.

(Continued)

*Primary Examiner*—Stacy A Whitmore
(74) *Attorney, Agent, or Firm*—Myers Bigel Sibley & Sajovec, P.A.

(57) ABSTRACT

A correction method and a system thereof automatically perform a measurement and an analysis for a photomask critical dimension (CD), to satisfy a desired CD uniformity and a desired mean-to-target (MTT) data. A correction for a portion where a CD error has occurred may be performed.

19 Claims, 7 Drawing Sheets

U.S. PATENT DOCUMENTS

2007/0196747 A1* 8/2007 Granik et al. .................. 430/30
2007/0209030 A1* 9/2007 Tabery et al. .................. 716/21

FOREIGN PATENT DOCUMENTS

KR      2003-0049940 A      6/2003
KR      10-0434494 B1      5/2004

OTHER PUBLICATIONS

Hemar et al., "The View from Above", *SPIE's oemagazine,* Feb. 2004, pp. 22-25.

Stegemann, "10 Years of Aerial Image Measurement Systems—AIMS™", *Future Fab International,* Issue 16.

* cited by examiner

METHODS, SYSTEMS AND COMPUTER PROGRAM PRODUCTS FOR CORRECTING PHOTOMASK USING AERIAL IMAGES AND BOUNDARY REGIONS

CROSS-REFERENCE TO RELATED PATENT APPLICATION

This application claims the benefit under 35 USC § 119 of Korean Patent Application No. 10-2005-0021095, filed on Mar. 14, 2005, the disclosure of which is hereby incorporated herein by reference in its entirety as if set forth fully herein.

FIELD OF THE INVENTION

The present invention relates to photomasks used in manufacturing microelectronic devices, and more particularly, to methods of correcting a photomask and correcting systems and computer program products thereof.

BACKGROUND OF THE INVENTION

Photomask processes are used in manufacturing microelectronic devices. The photomask includes a mask pattern defining a variety of elements. The size of the mask pattern may decrease as the integration density of microelectronic devices continues to increase. Since a high quality photomask may be difficult to obtain in the case of the development of a device of less than about 100 nm, and a manufacturing cost of the photomask may increase, may be desirable to obtain the high quality photomask to reduce the photomask manufacturing cost and/or a turn around time (TAT).

As the size of the mask pattern gets so small as to reach a resolution limit of the exposure tool, it may be difficult to transfer on the electronic device substrate a pattern of the same shape and critical dimension (CD) that correspond to the mask pattern formed on the photomask due to an optical proximity effect.

Generally, since a correction process such as an optical proximity effect correction (OPC) may have a small correction range, the process may not effectively deal with a process effect of a wide range and may not deal with a process variation. It may also be difficult to estimate and correct an influence due to a pattern density or a pattern dependence when manufacturing the photomask for the development of devices of less than about 100 nm.

Also, as illustrated in FIG. 1, as a design rule of the microelectronic device reduces, a mask pattern may not be uniformly transferred according to the CD of an initially designed pattern 8 but may vary as shown at 9, depending on the position when a mask pattern 5 of a photomask 3 is transferred on a wafer 7 by illumination from an exposure light source 1 (e.g., KrF excimer laser or ArF excimer laser). In other words, deterioration in a shot uniformity on a wafer may occur.

Efforts have been made to attempt to improve the shot uniformity on a wafer. Generally, there is provided a method of correcting a CD deviation, including: manufacturing a photomask; performing an exposure on a wafer; measuring a CD to obtain a CD deviation; and etching a backside of the photomask on which light is incident. However, the above method of attempting to improve the shot uniformity on a wafer by controlling transmittance of the backside of the photomask may not solve the problem that a light intensity (or exposure dose) may vary for each position due to various optical phenomena while the light incident on the backside of the photomask passes through the photomask. Since a wide area of the backside of the photomask should be etched so that a predetermined CD deviation correction effect can be obtained, a global shot uniformity improvement for a repeated cell pattern of a DRAM may be possible but it may be difficult to improve a local shot uniformity for a core/peripheral circuit region for which the OPC is performed. To improve the local shot uniformity, an appropriate treatment of a front surface of the photomask and an automated local CD measurement may be needed.

Also, although a wide range of CD measurement data for the entire region of the photomask may be needed to obtain exact correction data, the number of measurement points may be limited practically. Also, selected measurement points may not be representative for the entire region of the photomask. Particularly, a method of automatically measuring the CD may be needed in order to obtain exact information for the local CD of the core/periphery regions having a variety of pattern sizes and pitches, but it may be difficult to grasp the CD distribution and the tendency for the entire region of the photomask by mere measurement of the partial region of the photomask using OPC.

Aerial imaging is widely used for inspection of photomasks. As is understood by those having skill in the art, the aerial image of a mask defines the light intensity distribution at the wafer plane as produced by an exposure light source and projection optics. An inspection technology based on aerial imaging can, thus, alert an operator to defects that actually print, and allow an operator to ignore those that may be present on the mask but have no impact on the final result. Aerial imaging for photomask inspection are described, for example, in the publications to Hemar et al., entitled "The View from Above", *SPIE's oemagazine*, February 2004, pp. 22-25; Stegeman, entitled "10 Years of Aerial Image Measurement Systems—AIMSTM™", *Future Fab International*, Vol. 16, and Budd et al., entitled "Development and application of a new tool for lithographic mask evaluation, the stepper equivalent Aerial Image Measurement System, AIMS", *IBM J. Res. Develop.*, Vol. 41, No. 1/2, January/March 1997. pp. 119-128.

SUMMARY OF THE INVENTION

Methods of correcting a photomask according to exemplary embodiments of the present invention use an aerial image of the photomask to identify a portion of the photomask that is to be corrected. A region around the portion of the photomask that was identified using the aerial image of the photomask is then corrected. Analogous systems of correcting a photomask include an aerial image system that is configured to use an aerial image of the photomask to identify a portion of the photomask that is to be corrected, and a mask corrector that is configured to correct a region around the portion of the photomask that was identified by the aerial image system.

According to other embodiments of the present invention, methods of correcting a photomask include: (a) selecting a monitoring pattern among mask patterns formed on a surface of a photomask and defining a boundary region to be opened for correcting the monitoring pattern; (b) selecting a monitoring pattern for correction among the monitoring patterns and defining the selected monitoring pattern as a correction pattern without exposure on an electronic device substrate using an aerial image emulator capable of estimating a CD (critical dimension) transferred on the electronic device substrate through an aerial image on the electronic device substrate; and (c) opening the boundary region of the correction pattern to correct the correction pattern.

Here, the operation (b) may include: (b1) putting the photomask on a stage of the aerial image emulator; (b2) converting positions of the monitoring pattern and the boundary region into coordinates and storing the coordinates in the aerial image emulator; (b3) recognizing, at the aerial image emulator, an aerial image by a mask pattern of the photomask; (b4) finding a coordinate of the position and moving the state to perform a first alignment between the photomask and the aerial image emulator; (b5) performing, at the aerial image emulator, a second alignment by comparing the recognized aerial image with an ideal simulated aerial image memorized in advance in the aerial image emulator; and (b6) recognizing, at the aerial image emulator, a difference between the ideal simulated aerial image and the recognized aerial image with respect to the monitoring pattern, and if the difference deviates from tolerance, memorizing the monitoring pattern as a correction pattern.

The aerial image emulator may an Aerial Image Measurement System (AIMS) by Carl Zeiss Co. and/or a mask inspection tool.

The operation (b6) may include analyzing a CD transferred on the electronic device substrate and a mean to target (MTT) data using the monitoring pattern.

The operation (c) may include: coating a photoresist on a surface of the photomask and removing the photoresist of the boundary region to open the boundary region; and i) dry-etching the surface of the photomask on the opened boundary region to form a recess, or ii) wet-etching the surface of the photomask on the opened boundary region to form an undercut and a recess. The body of the photomask may be made of quartz.

In other embodiments, the operation (c) may include: depositing a transmittance control material on a surface of the photomask; and removing the transmittance control material deposited on a region that excludes the boundary region.

The monitoring pattern may be selected according to a region-based scheme for a repeated pattern or a pattern-based scheme for a deteriorated pattern having a narrow process margin and/or a narrow CD error margin.

The operation (c) may be performed after a position of the correction pattern is converted into a coordinate on a mask job deck so that a deteriorated pattern or region where a CD error has occurred is marked.

According to other embodiments of the present invention, there is provided a system for correcting a photomask including: a layout editor configured to convert positions of a monitoring pattern and a boundary region into coordinates when the monitoring pattern is selected among mask patterns formed on a front surface of the photomask and the boundary region to be opened for correcting the monitoring pattern is defined; an aerial image emulator configured to estimate a CD (critical dimension) transferred on an electronic device substrate through an aerial image on the electronic device substrate, to select a monitoring pattern that needs a correction among the monitoring pattern and to define the selected monitoring pattern as a correction pattern without an exposure on an electronic device substrate; a corrector configured to correct the correction pattern by opening the boundary region of the correction pattern; an MDP (mask data preparation) utility serving as an interface with the aerial image emulator and the corrector, and configured to transfer pattern information that includes positions of the monitoring pattern and the boundary region converted in the form of coordinates by the layout editor and a layout and a reduction ratio, to the aerial image emulator and the corrector, respectively; and a translation utility configured to deliver information of the correction pattern defined by the aerial image emulator to the corrector, the corrector configured to correct the correction pattern using the pattern information from the MDP utility and the correction pattern information from the translation utility.

The aerial image emulator may include: a first subsystem, such as a computer program module, configured to perform a first alignment between the photomask and the aerial image emulator by moving a stage of the aerial image emulator according to coordinated positions of the monitoring pattern and the boundary region when the photomask is put on the stage; and a second subsystem, such as a computer program module, configured to perform a second alignment by comparing, at the aerial image emulator, an aerial image recognized by a mask pattern of the photomask with an ideal simulated aerial image.

The aerial image emulator may memorize the monitoring pattern as a correction pattern when the aerial image emulator recognizes a difference between the ideal simulated aerial image and the recognized aerial image with respect to the monitoring pattern, and the difference deviates from a tolerance.

The aerial image emulator may be an Aerial Image Measurement System (AIMS) by Carl Zeiss Co. and/or a mask inspection tool. The aerial image emulator may analyze a CD transferred on the electronic device substrate and MTT data by the monitoring pattern.

The corrector may be configured to coat a photoresist on a surface of the photomask; remove the photoresist of the boundary region to open the boundary region; and dry-etch the surface of the photomask on the opened boundary region to form a recess, or may be configured to coat a photoresist on a surface of the photomask; remove the photoresist of the boundary region to open the boundary region; and wet-etch the surface of the photomask on the opened boundary region to form an undercut and a recess.

The corrector may also be configured to deposit a transmittance control material on a front surface of the photomask and remove the transmittance control material deposited on a region that excludes the boundary region.

DETAILED DESCRIPTION OF THE INVENTION

Figure 1:
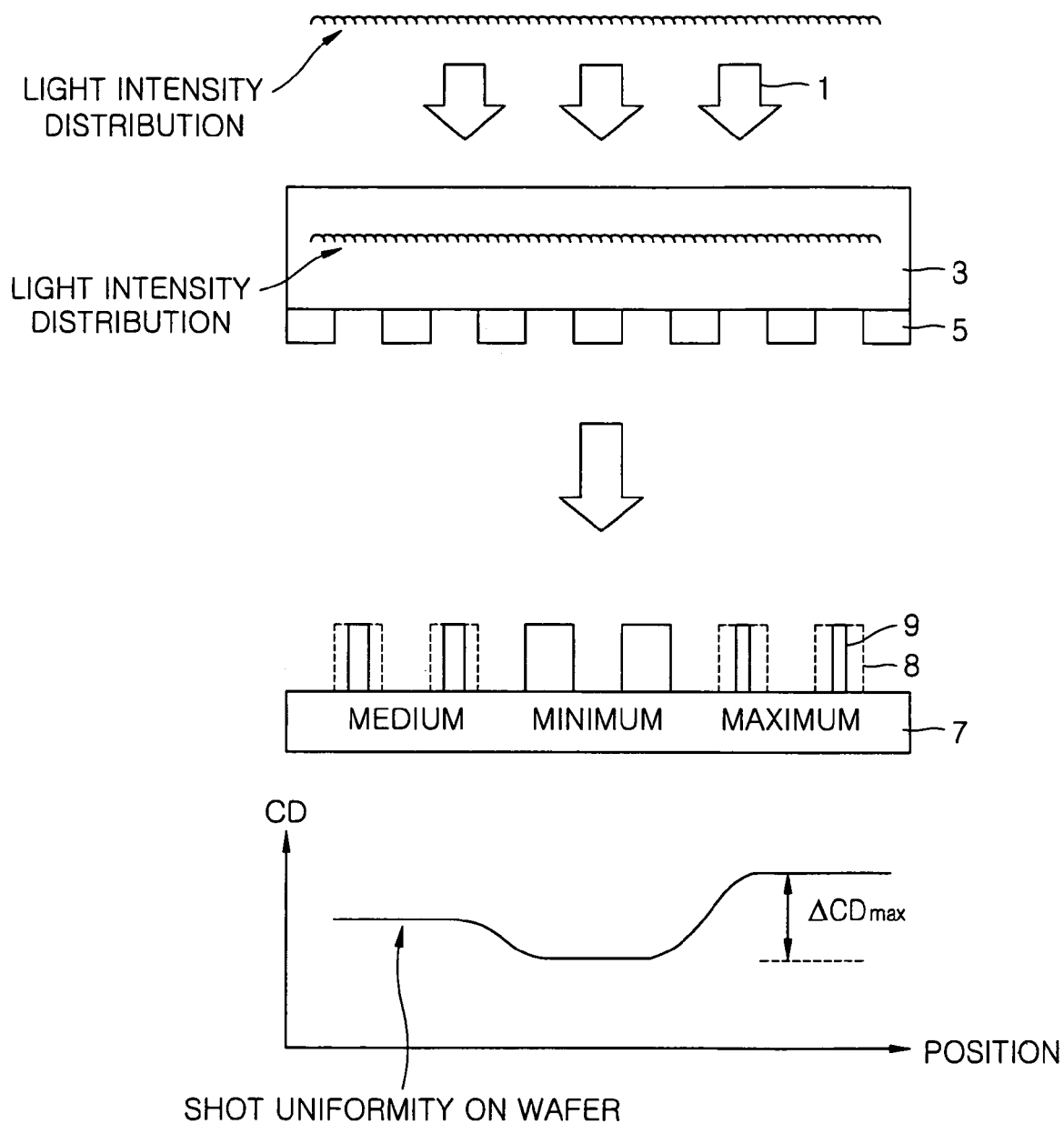
FIG. 1 is a schematic view illustrating shot non-uniformity on a wafer occurring when an exposure is performed using a conventional photomask.

The present invention now will be described more fully hereinafter with reference to the accompanying drawings, in which illustrative embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "coupled", "connected" or "responsive" to another element, it can be directly coupled, connected or responsive to the other element or intervening elements may also be present. In contrast, when an element is referred to as being "directly coupled", "directly connected" or "directly responsive" to another element, there are no intervening elements present. Like numbers refer to like elements throughout. As used herein the term "and/or" includes any and all combinations of one or more of the associated listed items and may be abbreviated by "/".

It will also be understood that, although the terms first, second, etc. may be used herein to describe various elements, these elements should not be limited by these terms. These terms are only used to distinguish one element from another element.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described in part below with reference to block diagrams and/or flowcharts of methods, systems and computer program products according to embodiments of the invention. It will be understood that a block of the block diagrams and/or flowcharts, and combinations of blocks in the block diagrams and/or flowcharts, may be implemented at least in part by computer program instructions. These computer program instructions may be provided to one or more enterprise, application, personal, pervasive and/or embedded computer systems, such that the instructions, which execute via the computer system(s) create means, modules, devices and/or methods for implementing the functions/acts specified in the block diagram block or blocks. Combinations of general purpose computer systems and/or special purpose hardware also may be used in other embodiments.

These computer program instructions may also be stored in memory of the computer system(s) that can direct the computer system(s) to function in a particular manner, such that the instructions stored in the memory produce an article of manufacture including computer-readable program code which implements the functions/acts specified in block or blocks. The computer program instructions may also be loaded into the computer system(s) to cause a series of operational steps to be performed by the computer system(s) to produce a computer implemented process such that the instructions which execute on the processor provide steps for implementing the functions/acts specified in the block or blocks. Accordingly, a given block or blocks of the block diagrams and/or flowcharts provides support for methods, computer program products and/or systems (structural and/or means-plus-function).

It should also be noted that in some alternate implementations, the functions/acts noted in the flowcharts may occur out of the order noted in the flowcharts. For example, two blocks shown in succession may in fact be executed substantially concurrently or the blocks may sometimes be executed in the reverse order, depending upon the functionality/acts involved. Finally, the functionality of one or more blocks may be separated and/or combined with that of other blocks.

A photomask, which is a target for correction in methods and/or systems of correction according to some embodiments of the present invention, is a photomask applied in manufacturing a variety of microelectronic devices. Description will be made below using a DRAM and a wafer for a microelectronic device and a microelectronic device substrate, respectively. However, the photomask, which is a target for correction of the present invention, can be applied in manufacturing integrated circuit semiconductor memory devices such as an SRAM, a flash memory device, processors such as a central processor unit (CPU), a digital signal processor (DSP), a combination of a CPU and a DSP, an application specific integrated circuit (ASIC), a micro-electro-mechanical system (MEMS) device, an optoelectronic device, a display device and/or other microelectronic devices that are fabricated using photomasks. DRAM devices are described for exemplary purposes only.

Also, the photomask that can be applied to correction methods and/or systems according to some embodiments of the present invention may be a binary mask (BM) formed of a quartz substrate and a chrome pattern and/or a rim-shift-phase shift mask (PSM) that forms a material film pattern for phase shift on a non-transmissive pattern formed of chrome. Also, the photomask may be an attenuated PSM (attPSM) that forms a half-tone film instead of the non-transmissive chrome pattern so that a phase difference may be induced and light of a phase difference may be transmitted with appropriate transmittance or adding a film formed of Mo to the conventional BM. Also, the photomask may be an alternating-PSM (ALT-PSM) that alternately forms material films for phase shift on a light-transmission region of a quartz substrate or alternately forms recesses for phase shift on a light-transmission region of a quartz substrate. Also, the photomask may be any other photomask including a chromeless phase shift mask.

Figure 2:
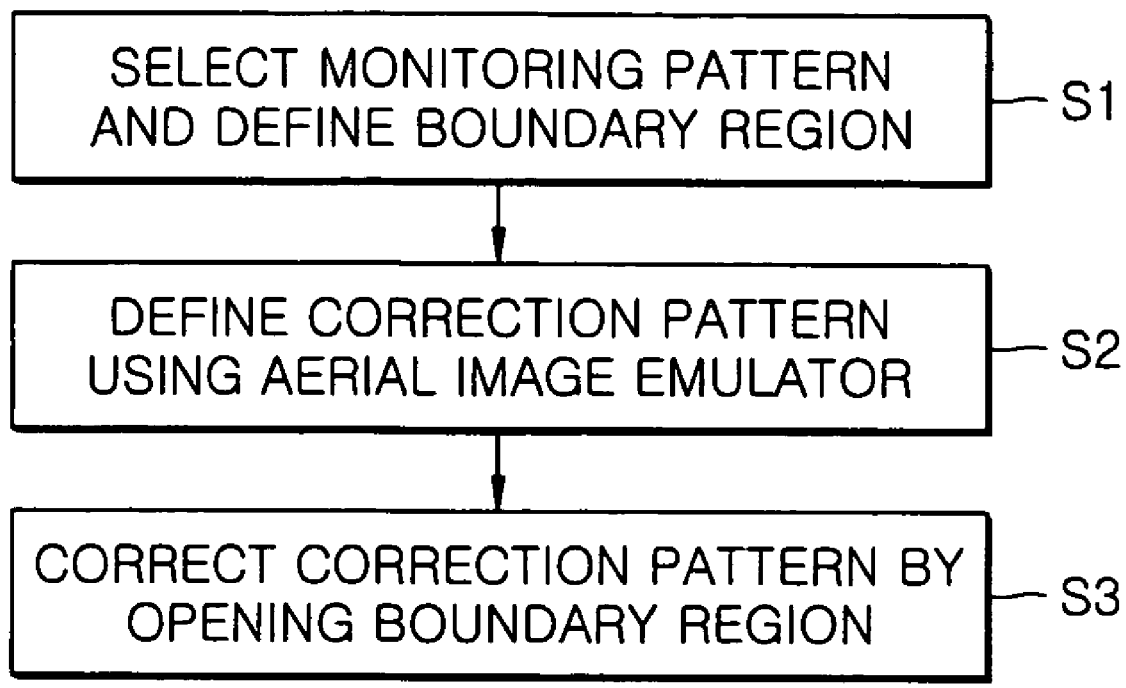
FIG. 2 is a flowchart of operations for correcting a photomask according to some embodiments of the present invention.
Figure 3:
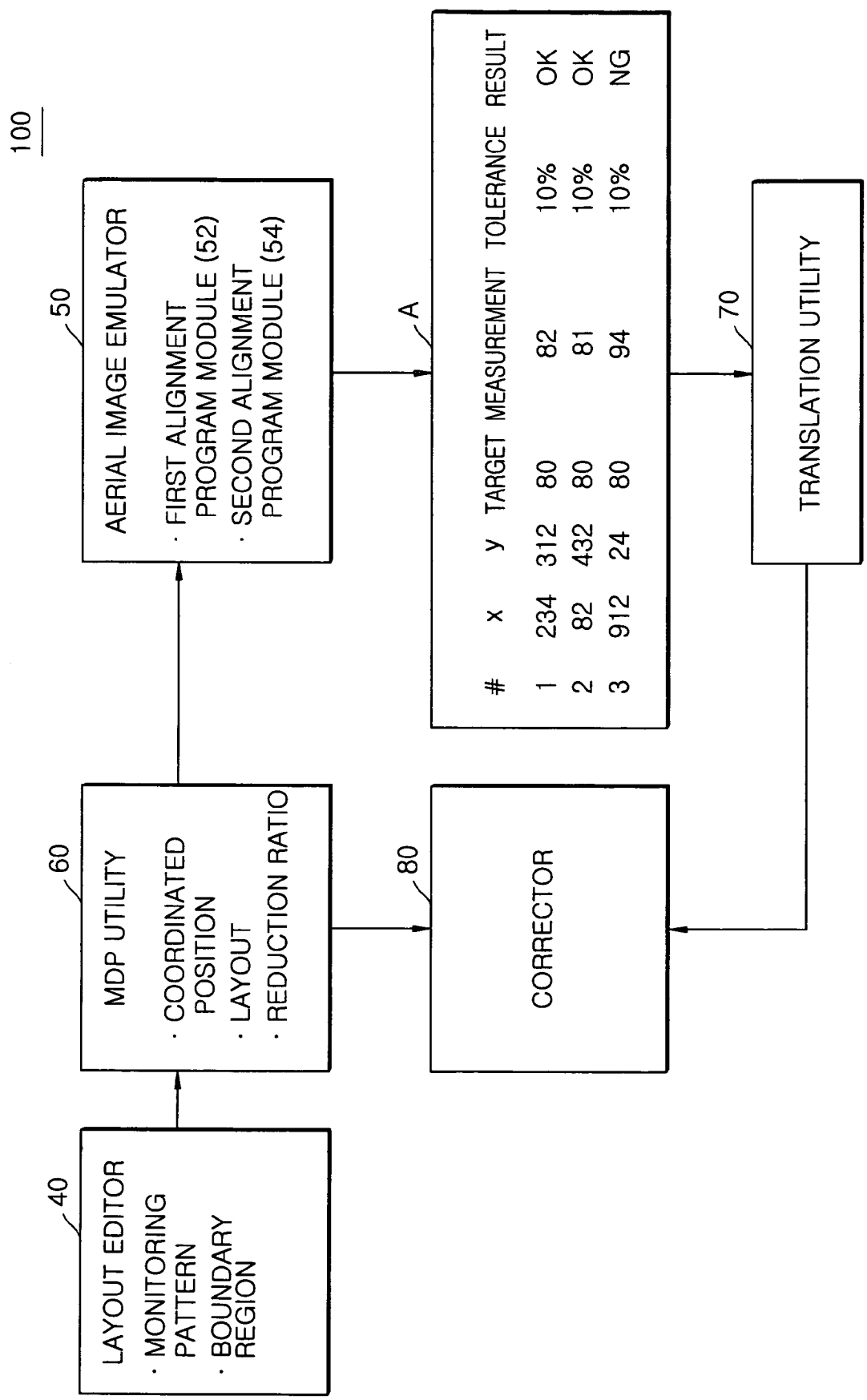
FIG. 3 is a schematic view of a system of correcting a photomask according to some embodiments of the present invention.

FIG. 2 is a flowchart of operations for correcting a photomask according to some embodiments of the present invention and FIG. 3 is a schematic view of a system 100 of correcting a photomask according to some embodiments of the present invention.

Referring to FIG. 2, a method of correcting the photomask includes: (S1) selecting a monitoring pattern among mask patterns formed on a surface (such as a front surface) of a photomask and defining a boundary region to be opened for correcting the monitoring pattern; (S2) selecting a monitoring pattern that needs correction among the monitoring patterns and defining the selected monitoring pattern as a correction pattern using an aerial image emulator without exposure on a wafer; and (S3) correcting the correction pattern by opening the boundary region of the correction pattern.

Such a correction method can be automatically performed by a correction system 100 illustrated in FIG. 3. Referring to FIG. 3, the correction system 100 includes: a layout editor 40; an aerial image emulator 50; a corrector 80; a mask data preparation (MDP) utility 60; and a translation utility 70.

For manufacturing a high quality photomask used in development of devices of less than about 100 nm, some embodiments of the present invention provide methods and systems capable of establishing an early appraisal system for a photomask quality and for correcting a local mask pattern CD of a photomask manufactured in advance by measuring and analyzing a CD on an electronic device substrate, transferred by the photomask, for a pattern or a region where a process margin is deteriorated, a measurement point arranged with a predetermined interval and/or other measurement points. For that purpose, a wide range of CD measurement data for the entire region of the photomask may be desirable, but, in reality, the number of the measurement points is typically limited. Therefore, it may be desirable to select a monitoring pattern measurement point that reduces or minimizes a burden in measurement while representing the entire region of the photomask.

The CD measurement should not be inclined to a specific region of the photomask. For realizing the number of measurement points into a level that can be actually applied, the monitoring point should be configured such that potentially significant patterns, including regions having a possibility of notching/bridging occurrence where the process margin deteriorates and/or patterns where a margin for the CD error (meaning that the CD deviates from a tolerance as well as the CD is not manufactured as desired) is narrow, may be uniformly arranged over the entire region of the photomask.

Two methods of selecting the monitoring pattern in the operation (S1) with such a criterion according to some embodiments of the present invention will now be described.

Figure 4:
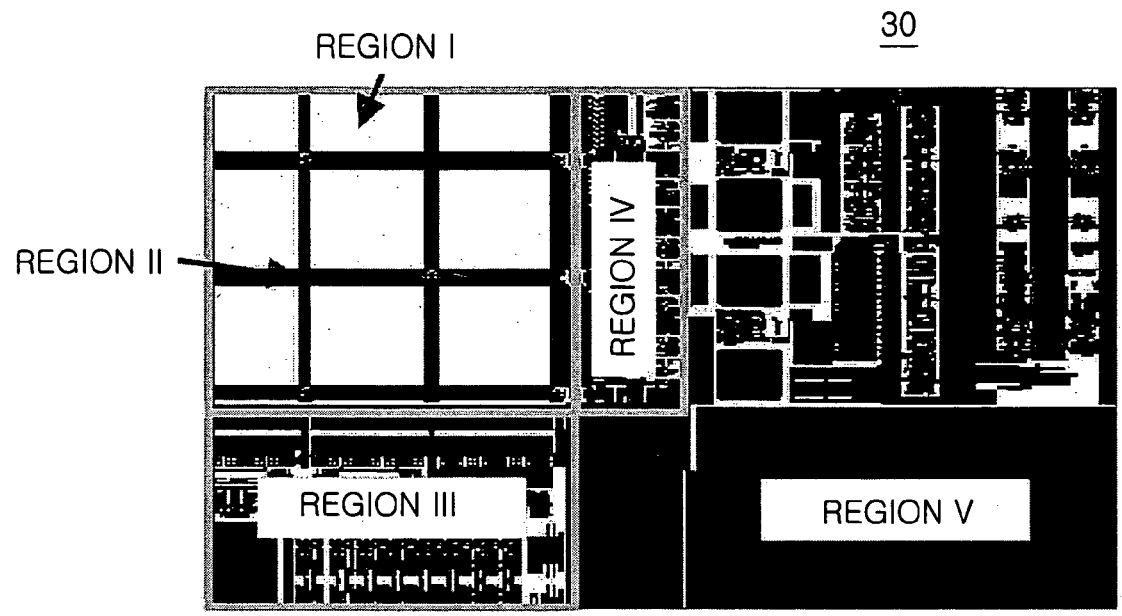
FIG. 4 is an exemplary view illustrating that a monitoring pattern is selected according to a region-based scheme according to some embodiments of the present invention in a photomask applied in manufacturing a DRAM.

The first method is to select the monitoring pattern according to a region-based scheme that can be oriented to a repeated pattern. FIG. 4 illustrates a photomask 30 applied in manufacturing a DRAM. Here, a mask substrate includes a chip region having a cell array region and a periphery circuit region. FIG. 4 exemplarily illustrates that region is divided into a region I, which is a cell region, a region II, which is a core region, a region III, a region IV, and a region V, which are periphery circuit regions, and the monitoring pattern is selected mainly for the repeated pattern.

Figure 5:
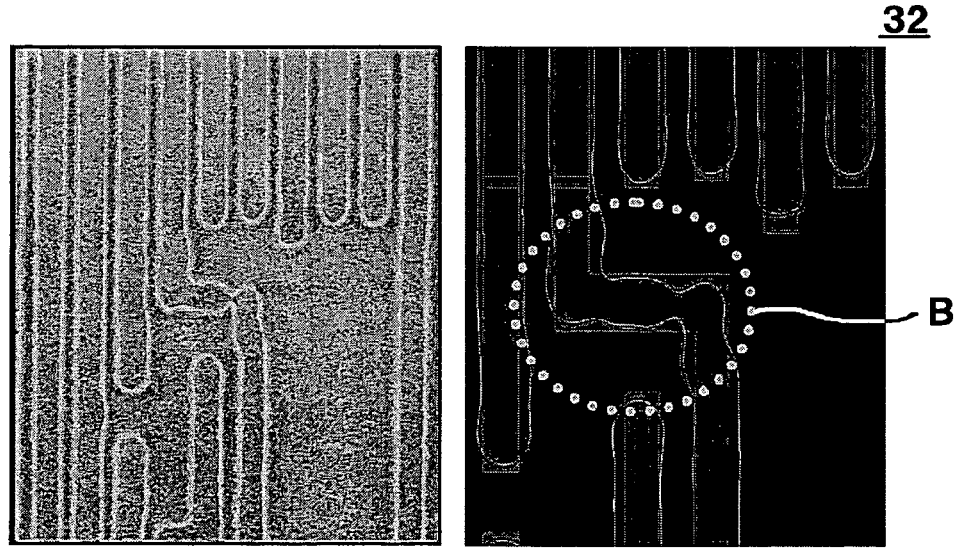
FIG. 5 is an exemplary view of a monitoring pattern that needs a correction according to a pattern-based scheme according to some embodiments of the present invention.

The second method is to select the monitoring pattern according to a pattern-based scheme for a deteriorated pattern where the process margin and/or the CD error margin is narrow. FIG. 5 is an exemplary view of a monitoring pattern that may need a correction according to a pattern-based scheme in some embodiments of the present invention. The left side in FIG. 5 is a photo showing that part of the pattern transferred on a microelectronic substrate by the photomask has been cut. At this point, since a portion marked by a dotted circle B on the photomask 32 illustrated on the right, is deteriorated, the portion is selected as the monitoring pattern.

As described above, the operation (S1) selects the monitoring pattern and defines the boundary region. When the mask pattern of the photomask is corrected, the only portion that may need correction is exposed and the other regions are covered with a photoresist. In some embodiments of the present invention, the boundary region refers to a neighboring region of the mask pattern opened when the correction is performed. The boundary region also can be called a bounding box. The boundary region may include therein only one monitoring pattern which becomes a target to be corrected, or may include other patterns in the neighborhood as well as the monitoring pattern.

The layout editor 40 of the correction system 100 illustrated in FIG. 3 converts the positions of the monitoring pattern and the boundary region into coordinates and takes the coordinates to the MDP utility 60 when the monitoring pattern is selected and the boundary region is defined as described above. The MDP utility 60 serves as an interface to transfer pattern information including the coordinated positions of the monitoring pattern and the boundary region by the layout editor 40, a layout and a reduction ratio to the aerial image emulator 50. In a DRAM manufacturing process, a reduction exposure of 4:1 is performed. For example, a mask pattern having a CD of 400 nm is transferred as a pattern having a CD of 100 nm on the electronic device substrate. Therefore, the reduction ratio in here can be 4:1. Next, the aerial image emulator 50 performs the operation (S2).

In some embodiments of the present invention, the aerial image emulator 50 may be an Aerial Image Measurement System (AIMS) by Carl Zeiss Co. and/or a mask inspection tool. The aerial image emulator 50 can estimate a CD transferred on the electronic device substrate using an aerial image on the electronic device substrate. Photolithography process exposes a radiation-sensitive material called a photoresist using light or other radiation pattern. Generally, the pattern is manufactured by passing the radiation of light through a mask. The mask includes a substrate having a pattern thereon. The pattern makes an exposed region and an unexposed region on the radiation-sensitive material by blocking part of the radiation or changes the phase of the radiation. An image formed on the photoresist is an example of an "aerial image" of the mask.

Some embodiments of the present invention can estimate a CD error of the mask pattern without exposure on the wafer by estimating the CD using the aerial image emulator 50 as described above. Up to now, conventional correction methods, e.g., a correction for a photomask pattern design, an OPC correction and a photomask correction, have been performed according to results after an exposure on a wafer has been performed. Accordingly, such correction methods may incur cost in manufacturing the wafer. However, since some embodiments of the present invention can correct the photomask before manufacturing the wafer, costs, efforts, and/or time can be reduced.

Figure 6:
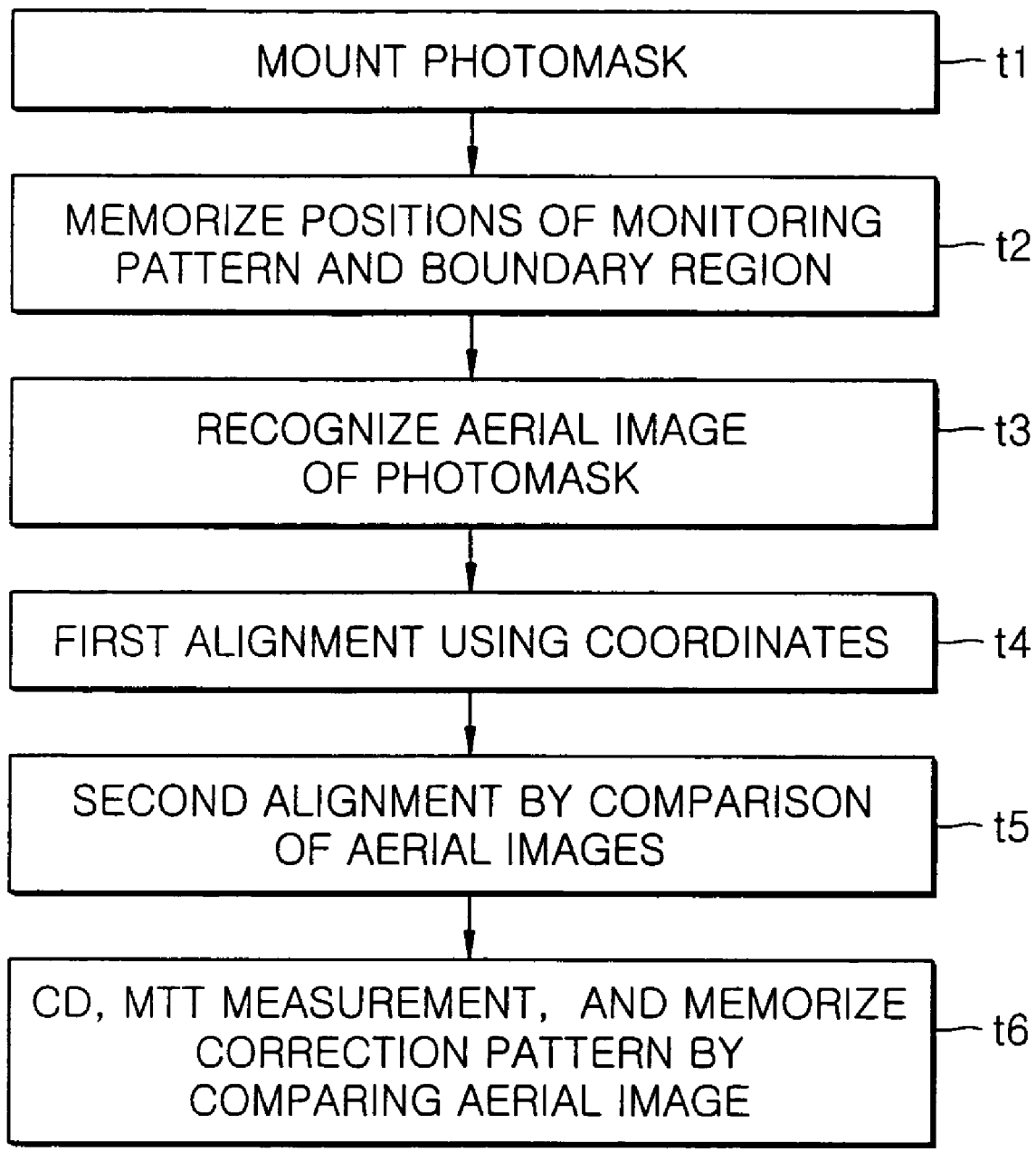
FIG. 6 is a view of detailed operations of a correction pattern defining operation using an aerial image emulator according to some embodiments of the present invention.

The operation (S2) using such an aerial image emulator 50 may include detailed operations illustrated in FIG. 6. Also, the aerial image emulator 50 can include a processor capable of all of the following detailed operations. A memory device may be coupled to the processor.

First, a photomask where the defining of the monitoring pattern and the boundary region has been performed is put on a stage of the aerial image emulator 50 (operation t1).

Next, the coordinated positions of the monitoring pattern and the boundary region are memorized in the aerial image emulator 50 (operation t2).

The aerial image emulator 50 recognizes an aerial image by the mask pattern of the photomask (operation t3).

After that, the coordinated positions are found to move the stage, so that a first alignment between the photomask and the aerial image emulator 50 is performed (operation t4). The first alignment can be a relatively coarse alignment.

Next, the aerial image emulator 50 compares the above recognized aerial image with an ideal simulated aerial image stored in the aerial image emulator 50 to perform a second alignment (operation t5). Such a second alignment can be a fine alignment.

As described above, to allow improved alignment accuracy, which can be problematic when automatic measurement is performed by the aerial image emulator 50, a coarse alignment is performed through the first alignment that uses a coordinate system, and then a fine alignment is performed through the second alignment that uses the simulated aerial image. For that purpose, the aerial image emulator 50 may include a computer program module 52 allowing the first alignment to be performed and another computer program module 54 allowing the second alignment to be performed.

The aerial image emulator 50 recognizes a difference between the ideal simulated aerial image and the recognized aerial image for the monitoring pattern and when the difference deviates from a tolerance, stores the monitoring pattern as a correction pattern (operation t6).

An operation t6 is illustrated in a table A of FIG. 3.

The aerial image for the monitoring pattern having coordinates x and y is compared with the ideal simulated aerial image, so that a CD and an MTT are measured. Assuming that a target is 80 nm and a tolerance is 10%, sample Nos. 1 and 2 having measured CDs 82 nm and 81 nm are considered as not being a correction pattern and thus judged 'ok' but a sample No. 3 having a measured CD 94 nm is considered as deviating from the tolerance and thus judged not good (NG) and stored as a correction pattern.

When the operation (S2) is completed in this manner, the information of the correction pattern defined by the aerial image emulator 50 is delivered to the corrector 80 by the translation utility 70. Particularly, the translation utility 70 converts the position of the correction pattern into a coordinate on the mask job deck to mark the deteriorated pattern or region where the CD error has occurred, and then can activate the corrector 80. The corrector 80 also receives pattern information from the MDP utility 60 to correct the correction pattern by opening the boundary region of the correction pattern using the received pattern and the correction pattern information, thereby automatically performing the operation (S3).

The operation (S3) increases or reduces the transferred CD by the photomask. In some embodiments, a dry-etching is used to increase the CD and a wet-etching is used to reduce the CD.

Figure 7:
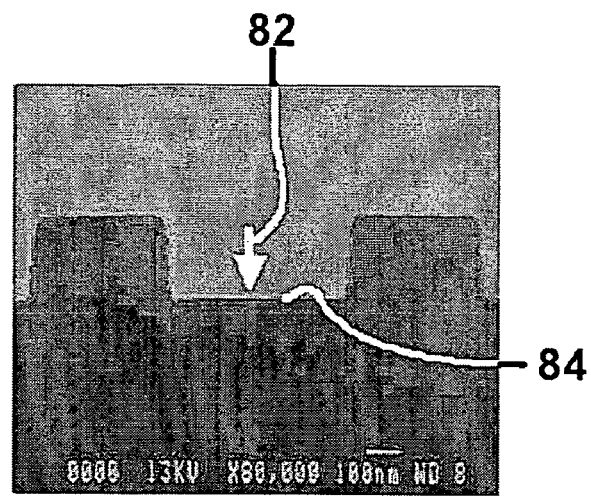
FIG. 7 is a view illustrating an operation of dry-etching a front surface of a photomask to increase a CD according to some embodiments of the present invention.

Referring to FIG. 7, to increase the CD, a photoresist is coated on a surface of the photomask, for example the front surface, and the photoresist on the boundary region is removed so that the boundary region may be opened. After that, the surface of the photomask on the opened boundary region is dry-etched (82) to form a recess 84. The dry-etching may be a reactive dry-etching method using gas of $CF_4+O_2$ series or gas where $SF_6$, He, and $O_2$ are mixed.

A phase difference $\Delta\phi$ and a depth t of the recess 84 have the following relationship:

$$\Delta\phi=2\pi(n_i-1)t/\lambda,$$ [Equation 1]

where $n_i$ is a refractive index of the photomask substrate and $\lambda$ is a wavelength of an exposure light source.

For example, in the case where the photomask substrate is made of fused silica, a depth t of the recess 84 for generating a phase difference of 180° is 2470 Å when a KrF excimer laser having a wavelength $\lambda$ of 248 nm is used and a depth is 1850 Å when a ArF excimer laser having a wavelength $\lambda$ of 193 nm is used. Particularly, in the case where the photomask substrate is made of quartz, a phase difference is computed to increase by about 1° every time the depth of the recess 84 is deepened by 13.4 Å.

Figure 8:
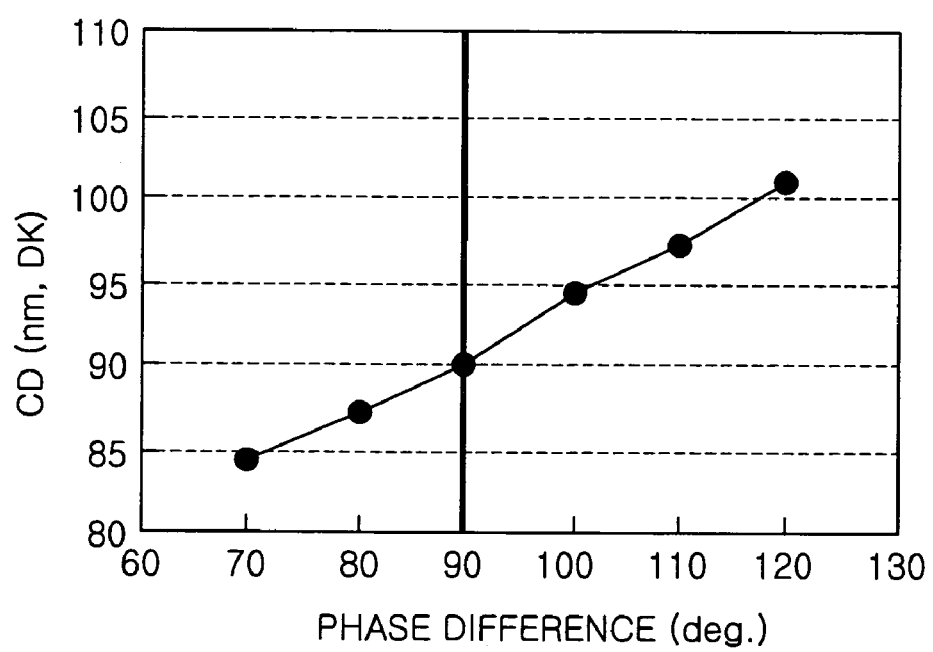
FIG. 8 is a graph illustrating a CD change by a phase difference due to a dry-etching of FIG. 7 according to some embodiments of the present invention.

As a result of experiments by the inventors, it was revealed that a CD of a dark pattern such as a gate line increases 3.5 nm as the depth is 10° more dry-etched in the case where the target is a phase difference of 90° as illustrated in FIG. 8.

Figure 9:
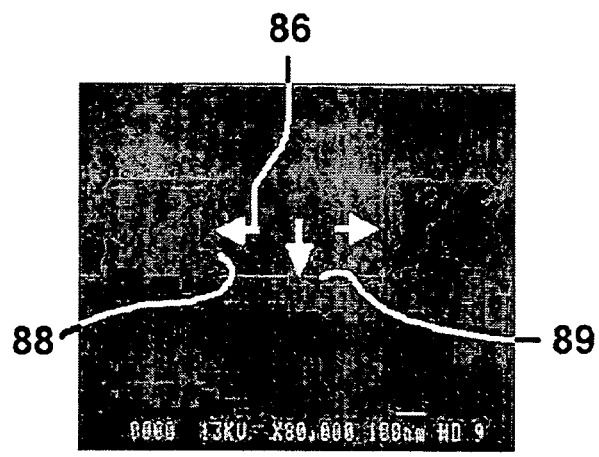
FIG. 9 is a view illustrating an operation of wet-etching a front surface of a photomask to reduce a CD according to some embodiments of the present invention.
Figure 10:
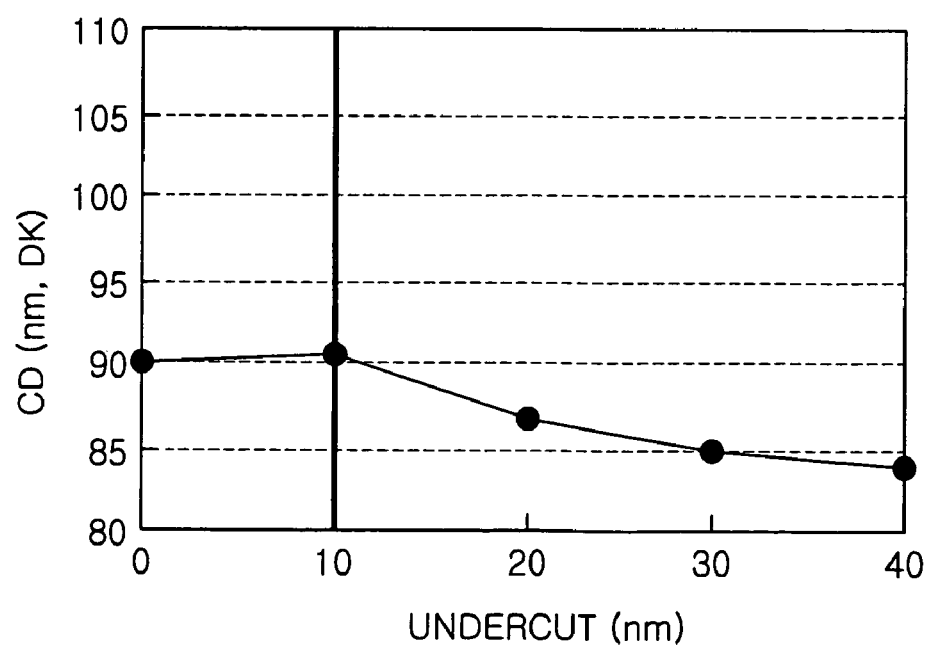
FIG. 10 is a graph illustrating a CD change by an undercut size due to a wet-etching of FIG. 9 according to some embodiments of the present invention.

Referring to FIG. 9, to reduce the CD, the photoresist is coated on a surface of the photomask, such as the front surface, and the photoresist on the boundary region is removed so that the boundary region may be opened. After that, the surface of the photomask on the opened boundary region is wet-etched (86), so that an undercut 88 and a recess 89 are formed.

As a result of experiments by the inventors, a CD of a dark pattern such as a gate line was reduced 2.4 nm as the wet-etching is performed so that a size of the undercut may be 10 nm.

Instead of, or in addition to, the etching, the CD of the mask pattern may be corrected by depositing a transmittance control material on a surface, such as the front surface, of the photomask and removing the transmittance control material deposited on a region that excludes the boundary region. The transmittance control material may be spin on glass (SOG), for example.

As described above, some embodiments of the present invention can estimate the CD transferred on the electronic device substrate using the aerial image emulator capable of estimating the CD transferred on the electronic device substrate through the aerial image on the electronic device substrate, such as the AIMS and/or the mask inspection tool even without a scanner using metrology tools. Some embodiments of the present invention can analyze the CD of a specific region where the deteriorated pattern having a narrow process margin or the repeated pattern exists and automatically perform correction if necessary. When many boundary regions are opened, a global correction can be performed as well as the local correction.

Therefore, according to some embodiments of the present invention, the CD deviation can be corrected accurately by more efficiently appraising the CD and the MTT transferred on the electronic device substrate by the photomask and the correction system can automatically perform all of the processes, which can provide efficiency.

Some embodiments of the present invention can estimate and analyze the wafer CD for the potential deterioration point or the CD monitoring pattern in the operation of manufacturing the photomask, thereby establishing a flow capable of performing the mask quality appraisal and the early appraisal (normality, abnormality, judgement whether to perform a repair or a correction), judgment as to the early mask correction, and/or the mask repair/correction before exposure on the electronic device substrate.

Also, some embodiments of the present invention can contribute in fundamentally reducing the CD error occurring in an e-beam writing and the mask etching process by applying the mask analysis method.

Since some embodiments of the present invention can improve or optimize the mask and perform the MTT correction through the correction of the front surface of the photomask, some embodiments of the present invention may give such a new technique a name "front-side reticle optimization and MTT correction (FROM)".

Conventionally, after the exposure is performed on the wafer and the CD is measured, the photomask is corrected. However, as described above, some embodiments of the present invention measure and analyze the mask CD mainly for the pattern or the region where the process margin is deteriorated or the measurement points arranged with a predetermined interval before the exposure on the electronic device substrate in order to manufacture a high quality photomask, which can be used for development of the devices of less than about 100 nm. Therefore, time, efforts, and/or manufacturing cost can be reduced. Further, it is possible to appraise the CD and the MTT quality for the entire mask if necessary.

Accordingly, it is possible to perform an early judgment whether the mask is normal, an early judgment whether the mask defect correction is necessary, and a correction for the mask CD error according to some embodiments of the present invention. Also, it is possible to perform an early appraisal for the mask quality and a local CD correction for the mask manufactured in advance according to some embodiments of the present invention. Since the mask correction can be reduced or minimized through above processes, the mask manufacturing TAT and/or the manufacturing costs can be reduced.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of correcting a photomask comprising:
   (a) selecting a monitoring pattern among mask patterns formed on a surface of a photomask and defining a boundary region to be opened for correcting the monitoring pattern;
   (b) defining a correction pattern for the selected monitoring pattern without an exposure on an electronic device substrate using an aerial image emulator capable of estimating a critical dimension (CD) transferred on the electronic device substrate through an aerial image of the electronic device substrate; and
   (c) opening the boundary region of the correction pattern to correct the correction pattern, wherein the operation (b) comprises:
   (b1) putting the photomask on a stage of the aerial image emulator;
   (b2) converting positions of the monitoring pattern and the boundary region into coordinates and storing the coordinates in the aerial image emulator;
   (b3) recognizing, at the aerial image emulator, an aerial image by a mask pattern of the photomask;
   (b4) finding a coordinate of the position and moving the stage to perform a first alignment between the photomask and the aerial image emulator;
   (b5) performing, at the aerial image emulator, a second alignment by comparing the recognized aerial image with an ideal simulated aerial image memorized in advance in the aerial image emulator; and
   (b6) recognizing, at the aerial image emulator, a difference between the ideal simulated aerial image and the recognized aerial image with respect to the monitoring pattern, and when the difference deviates from tolerance, defining the monitoring pattern as a correction pattern.

2. The method of claim 1, wherein the aerial image emulator is one of an Aerial Image Measurement SYStem (AIMS) by Carl Zeiss Co. and/or a mask inspection tool.

3. The method of claim 1, wherein the operation (b6) comprises analyzing a CD transferred on the electronic device substrate and mean to target (MTT) data using the monitoring pattern.

4. The method of claim 1, wherein the operation (c) comprises:
   coating a photoresist on a surface of the photomask;
   removing the photoresist of the boundary region to open a boundary region thereof; and
   dry-etching the surface of the photomask on the opened boundary region to form a recess.

5. The method of claim 4, wherein a body of the photomask comprises quartz.

6. The method of claim 1, wherein the operation (c) comprises:
   coating a photoresist on a surface of the photomask;
   removing the photoresist of the boundary region to open a boundary region thereof; and
   wet-etching the surface of the photomask on the opened boundary region to form an undercut and a recess.

7. The method of claim 6, wherein a body of the photomask comprises quartz.

8. The method of claim 1, wherein the operation (c) comprises:
   depositing a transmittance control material on a surface of the photomask; and
   removing the transmittance control material deposited on a region that excludes the boundary region.

9. The method of claim 1, wherein the operation (b) comprises:
   selecting the monitoring pattern according to a region-based scheme for a repeated pattern.

10. The method of claim 1, wherein the operation (b) comprises:
    selecting the monitoring pattern according to a pattern-based scheme for a deteriorated pattern having a narrow process margin and/or a narrow CD error margin.

11. The method of claim 1, wherein the operation (c) is performed after a position of the correction pattern is converted into a coordinate on a mask job deck so that a deteriorated pattern or region where a CD error has occurred is marked.

12. A system for correcting a photomask comprising:
    a layout editor configured to convert into coordinates positions of monitoring patterns that are selected from mask patterns on a photomask and boundary regions that are defined around the monitoring patterns to be opened for correcting the corresponding monitoring pattern;
    an aerial image emulator configured to estimate a critical dimension (CD) transferred on an electronic device substrate through an aerial image on the electronic device substrate and to select a monitoring pattern among the monitoring patterns for correction and to define the selected monitoring pattern as a correction pattern without an exposure on the electronic device substrate;
    a corrector configured to correct the correction pattern by opening a boundary region of the correction pattern;
    a mask data preparation (MDP) utility serving as an interface with the aerial image emulator and the corrector, and configured to transfer pattern information that includes positions of the monitoring pattern and the boundary region converted in the form of coordinates by the layout editor and a layout and a reduction ratio, to the aerial image emulator and the corrector, respectively; and
    a translation utility configured to deliver information of the correction pattern defined by the aerial image emulator to the corrector, the corrector configured to correct the correction pattern using the pattern information from the MDP utility and the correction pattern information from the translation utility.

13. The system of claim 12, wherein the aerial image emulator comprises:
   a first subsystem configured to perform a first alignment between the photomask and the aerial image emulator by moving a stage of the aerial image emulator according to the coordinated positions of the monitoring pattern and the boundary region when the photomask is put on the stage; and
   a second subsystem configured to perform a second alignment by comparing, at the aerial image emulator, an aerial image recognized by a mask pattern of the photomask with an ideal simulated aerial image.

14. The system of claim 13, wherein the aerial image emulator is configured to memorize the monitoring pattern as a correction pattern when the aerial image emulator recognizes a difference between the ideal simulated aerial image and the recognized aerial image with respect to the monitoring pattern and the difference deviates from a tolerance.

15. The system of claim 14, wherein the aerial image emulator analyzes a CD transferred on the electronic device substrate and mean to target (MTT) data using the monitoring pattern.

16. The system of claim 12, wherein the aerial image emulator is one of an Aerial Image Measurement SYStem (AIMS) by Carl Zeiss Co. and/or a mask inspection tool.

17. The system of claim 12, wherein the corrector is configured to perform the following:
   coating a photoresist on a surface of the photomask;
   removing a photoresist of the boundary region to open the boundary region; and
   dry-etching the surface of the photomask on the opened boundary region to form a recess.

18. The system of claim 12, wherein the corrector is configured to perform the following:
   coating a photoresist on a surface of the photomask;
   removing a photoresist of the boundary region to open the boundary region; and
   wet-etching the surface of the photomask on the opened boundary region to form an undercut and a recess.

19. The system of claim 12, wherein the corrector is configured to deposit a transmittance control material on a surface of the photomask and to remove the transmittance control material deposited on a region that excludes the boundary region.

* * * * *